(12) United States Patent
Lim

(10) Patent No.: US 7,692,225 B2
(45) Date of Patent: Apr. 6, 2010

(54) CMOS IMAGE SENSOR

(75) Inventor: Keun Hyuk Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 384 days.

(21) Appl. No.: 11/611,341

(22) Filed: Dec. 15, 2006

(65) Prior Publication Data

US 2007/0145444 A1 Jun. 28, 2007

(30) Foreign Application Priority Data

Dec. 28, 2005 (KR) .................. 10-2005-0132681

(51) Int. Cl.
*H01L 27/146* (2006.01)
(52) U.S. Cl. ................ 257/292; 257/E31.032
(58) Field of Classification Search .......... 257/291, 257/72, 431, 292
See application file for complete search history.

(56) References Cited

U.S. PATENT DOCUMENTS

| | | | |
|---|---|---|---|
| 6,420,218 B1 | 7/2002 | Yu | |
| 6,849,886 B1 | 2/2005 | Han | |
| 2007/0108476 A1* | 5/2007 | Hong | ................ 257/225 |

FOREIGN PATENT DOCUMENTS

| | | |
|---|---|---|
| CN | 1121263 A | 4/1996 |
| KR | 10-2004-0070798 | 8/2004 |

\* cited by examiner

*Primary Examiner*—Jerome Jackson, Jr.
*Assistant Examiner*—Paul A Budd
(74) *Attorney, Agent, or Firm*—Saliwanchik, Lloyd & Saliwanchik

(57) ABSTRACT

Disclosed are a CMOS image sensor and a method for manufacturing the same. The CMOS image sensor includes a photodiode area and a floating diffusion area formed on a semiconductor substrate, a transistor formed on the semiconductor substrate between the photodiode area and the floating diffusion area, an isolation layer formed below the transistor, and a channel area formed between the transistor and the isolation layer.

11 Claims, 4 Drawing Sheets

CMOS IMAGE SENSOR

RELATED APPLICATION(S)

This application claims the benefit under 35 U.S.C. § 119(e) of Korean Patent Application No. 10-2005-0132681 filed Dec. 28, 2005, which is incorporated herein by reference in its entirety.

FIELD OF THE INVENTION

The present invention relates to a CMOS sensor and a method of manufacturing the same.

BACKGROUND OF THE INVENTION

In general, an image sensor is a semiconductor device for converting optical images into electric signals, and is classified into a charge coupled device (CCD) or a CMOS image sensor.

A CCD has a plurality of photodiodes (PDs), which are arranged in the form of a matrix in order to convert optical signals into electric signals. CCDs also include a plurality of vertical charge coupled devices (VCCDs) provided between photodiodes vertically arranged in the matrix. The VCCDs transmit electric charges in the vertical direction when the electric charges are generated from each photodiode. Additionally, CCDs have a plurality of horizontal charge coupled devices (HCCDs) for transmitting the electric charges that have been transmitted from the VCCDs in the horizontal direction; and a sense amplifier for outputting electric signals by sensing the electric charges being transmitted in the horizontal direction.

However, a CCD image sensor has various disadvantages, such as a complicated drive mode and high power consumption. Also, the CCD requires multi-step photo processes, so the manufacturing process is complicated.

In addition, it is difficult to integrate a controller, a signal processor, and an analog/digital converter (A/D converter) onto a single chip of the CCD. This leads to the CCD being unsuitable for compact-size products.

Recently, the CMOS image sensor has been spotlighted as a next-generation image sensor capable of solving the problems of the CCD.

The CMOS image sensor is a device employing a switching mode to sequentially detect an output of each unit pixel by means of MOS transistors using peripheral devices such as a controller and a signal processor. The MOS transistors are formed on a semiconductor substrate corresponding to each of the unit pixels through a CMOS technology.

That is, the CMOS sensor includes a photodiode PD and a MOS transistor in each unit pixel, and sequentially detects the electric signals of each unit pixel through the MOS transistor in a switching mode, so as to realize an image.

Since the CMOS image sensor makes use of the CMOS technology, the CMOS image sensor has advantages such as low power consumption and a simple manufacturing process with relatively fewer photo processing steps.

In addition, the CMOS image sensor allows the product to have a compact size because the controller, the signal processor, and the A/D converter can be integrated onto a single chip.

Accordingly, the CMOS image sensor has been extensively used in various applications, such as digital still cameras and digital video cameras.

The CMOS image sensors are classified into 3T, 4T and 5T-type CMOS image sensors according to the number of transistors formed in each unit pixel. The 3T-type includes one photodiode and three transistors, and the 4T-type includes one photodiode and four transistors.

The layout for a unit pixel of the 4T-type CMOS image sensor will now be described.

FIG. 1 is an equivalent circuit of a 4T-type CMOS image sensor according to a related art, and FIG. 2 is a layout showing a unit pixel of the 4T-type CMOS image sensor according to the related art.

As shown in FIG. 1, a unit pixel 100 of the CMOS image sensor includes a photodiode 10 serving as a photoelectric converting part and four transistors.

The four transistors are transfer, reset drive and selection transistors 20, 30, 40 and 50, respectively. Further, a load transistor 60 is electrically connected to an output terminal OUT of each unit pixel 100.

Reference character FD denotes a floating diffusion area, and reference characters Tx, Rx, and Sx denote gate voltages of the transfer, reset, and selection transistors 20, 30, and 50, respectively.

As shown in FIG. 2, the unit pixel of the 4T-type CMOS image sensor has an active area defined thereon. An isolation layer is formed on a predetermined area of the unit pixel, but not on the active area. One photodiode PD is formed on a wider region of the active area, and gate electrodes 23, 33, 43 and 53 of four transistors are formed overlapping the remaining regions of the active area.

The first gate electrode 23 corresponds to the transfer transistor 20, the second gate electrode 33 incorporates with corresponds to the reset transistor 30, the third gate electrode 43 corresponds to the drive transistor 40, and the fourth gate electrode 53 corresponds to the select transistor 50.

Dopants are implanted into the active area of each transistor except for below lower portions of the gate electrodes 23, 33, 43 and 53. This causes the formation of source/drain (S/D) areas of the transistors.

FIGS. 3A to 3C are sectional views taken along line I-I' of FIG. 2 and illustrate a manufacturing process of a CMOS image sensor according to the related art.

Referring to FIG. 3A, a low density P type epitaxial layer 62 is formed on a high density P type semiconductor substrate 61 through an epitaxial process.

Subsequently, an active area and an isolation area are defined on the semiconductor substrate 61, and an isolation layer 63 is formed in the isolation area through an STI process.

In addition, an insulating layer and a conductive layer (for example, a high-density multi-crystalline silicon layer) are sequentially deposited on the entire surface of the epitaxial layer 62 formed with the isolation layer 63. Then, the conductive layer and the insulating layer are selectively removed, thereby forming a gate electrode 65 and a gate insulating layer 64.

Next, referring to FIG. 3B, a first photoresist film is coated on the entire surface of the semiconductor substrate 61 and patterned through an exposure and development process in such a manner that blue, green and red photodiode areas are exposed.

Then, low-density N type dopants are implanted onto the epitaxial layer 62 by using the patterned first photoresist film as a mask, thereby forming a low-density N type diffusion area 67 that serves as blue, green and red photodiode areas.

Subsequently, the first photoresist film is completely removed, an insulating layer is deposited on the entire surface of the semiconductor substrate 61, and an etchback process is performed to form spacers 68 at both sides of the gate electrode 65.

Next, a second photoresist film is coated on the entire surface of the semiconductor substrate 61 and patterned through an exposure and development process, such that the photodiode area is covered and the source/drain area of each transistor is exposed.

Then, high-density n type dopants are implanted onto the exposed source/drain area by using the patterned second photoresist film as a mask, thereby forming an n type diffusion area (floating diffusion area) 70.

After that, referring to FIG. 3D, the second photoresist film is removed, and a third photoresist film is coated on the entire surface of the semiconductor substrate 61. An exposure and development process is performed with respect to the third photoresist film, so that it is patterned to expose each photodiode area.

Then, p type dopants are implanted onto the photodiode area having the n type diffusion area 67 by using the patterned third photoresist film as a mask, thereby forming a p type diffusion area 72 on the surface of the semiconductor substrate. Then, the third photoresist film is removed, and a heat-treatment process is performed with respect to the semiconductor substrate 61, thereby expanding each impurity diffusion area.

During operation, electrons are generated in the photodiode area by the incident light. The transfer transistor is turned on to transfer the generated electrons from the photodiode area, which is the N type diffusion area 67, to the N type diffusion area 70 for temporary storage.

However, punchthrough (see reference numeral 76) between the N type diffusion area 70 and the low-density N type diffusion area 67 of the transfer transistor may be caused by the expansion of a depletion area 74 of the N type diffusion area 67 formed in the photodiode area, thereby degrading the characteristic of the CMOS image sensor.

BRIEF SUMMARY

An object of the present invention is to provide a CMOS image sensor capable of improved optical sensitivity, and a method for manufacturing the same.

In order to accomplish the object of the present invention, there is provided a CMOS image sensor including: a photodiode area and a floating diffusion area formed on a semiconductor substrate, a transistor formed between the photodiode area and the floating diffusion area on the semiconductor substrate, an isolation layer formed below the transistor, and a channel area formed between the transistor and the isolation layer.

According to another aspect of the present invention, there is provided a method for manufacturing a CMOS image sensor. The method comprises the steps of: forming a first isolation layer for defining an active area on a semiconductor substrate; forming a second isolation layer in the active area; forming a channel area on the second isolation layer by removing a portion of the second isolation layer and filling the removed portion with a conductive layer; forming a gate insulating layer and a gate electrode on an upper side of the channel area; forming a photodiode area at one side of the channel area; and forming a floating diffusion area at another side of the channel area.

DETAILED DESCRIPTION OF THE INVENTION

A CMOS image sensor and a fabrication method thereof according to the present invention will now be described with reference to the accompanying drawings.

Figure 1:
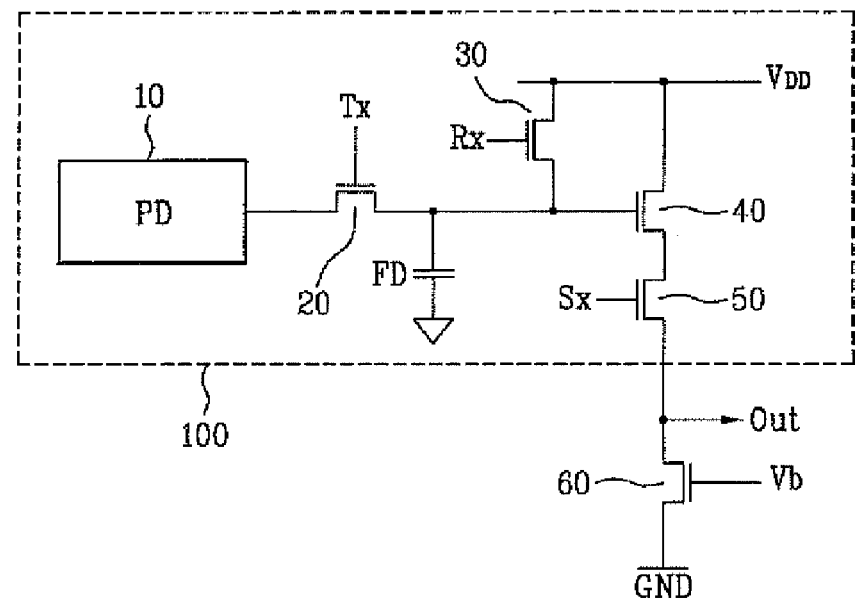
FIG. 1 is an equivalent circuit diagram illustrating a 4T-type CMOS image sensor according to a related art.
Figure 2:
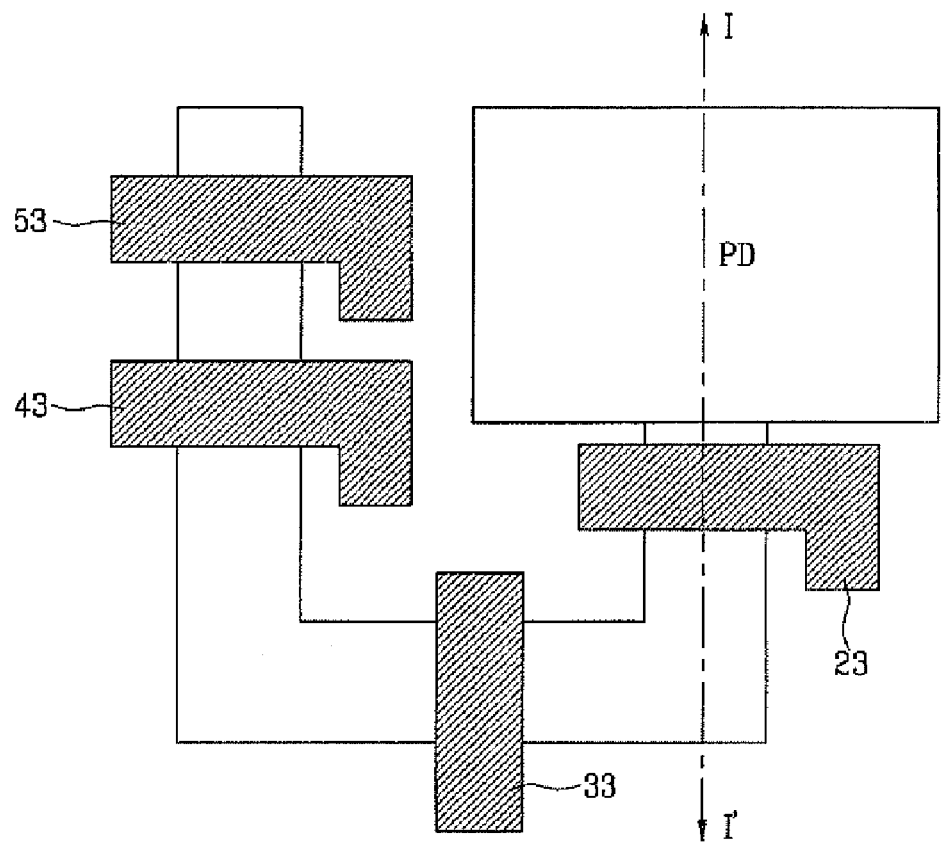
FIG. 2 is a layout view showing a unit pixel of a 4T-type CMOS image sensor according to the related art.
Figure 3A:
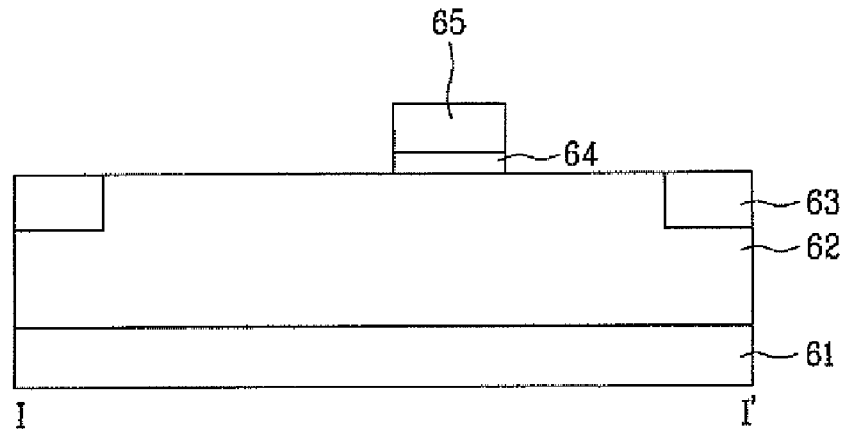
FIGS. 3A to 3C are sectional views showing a method for manufacturing a CMOS image sensor according to the related art.
Figure 3B:
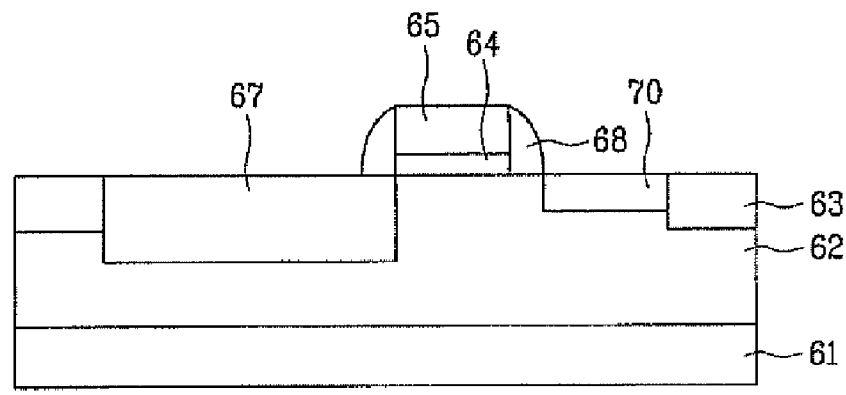
Figure 3C:
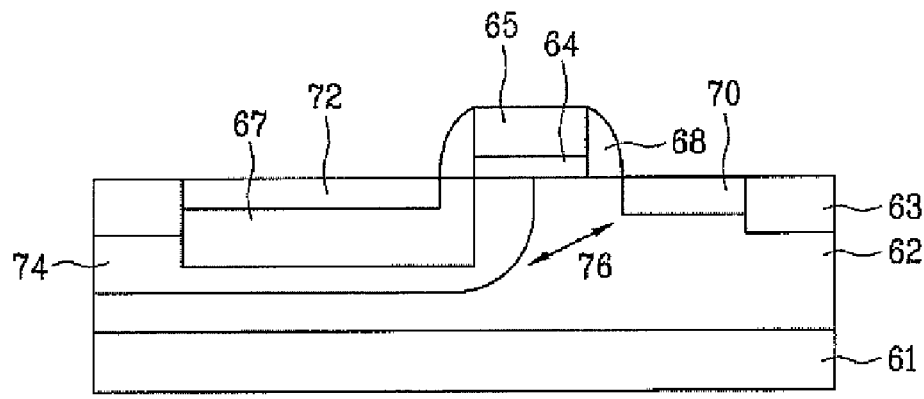

FIGS. 4A to 4E are sectional views taken along line I-I' of FIG. 2 and show a method for manufacturing a CMOS image sensor according to an embodiment of the present invention.

Figure 4A:
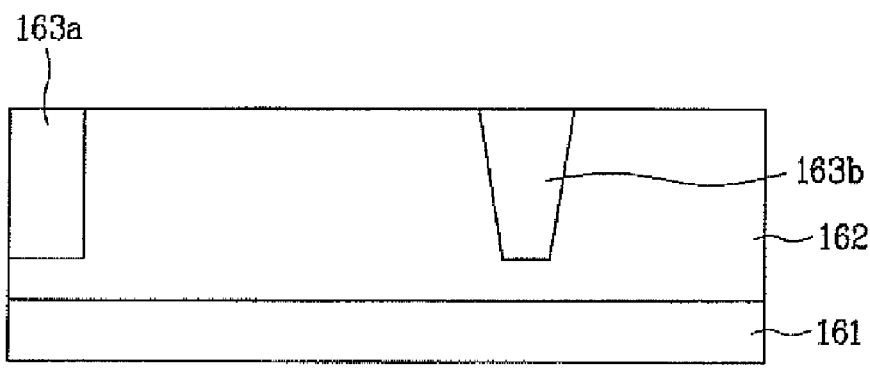
FIGS. 4A to 4E are sectional views showing a method for manufacturing a CMOS image sensor according to an embodiment of the present invention.

Referring to FIG. 4A, an epitaxial process can be performed with respect to a high-density P type semiconductor substrate 161, thereby forming a low-density P type epitaxial layer 162.

Then, after defining an active area and an isolation area on the semiconductor substrate 161, first and second isolation layers 163a and 163b can be formed on the isolation area and a gate electrode area through a shallow trench isolation (STI) process.

Although it is not shown in drawings the first and second isolation layers 163a and 163b can be formed as follows. First, a pad oxide layer, a pad nitride layer, and a tetra ethyl ortho silicate (TEOS) oxide layer can be sequentially formed on the semiconductor substrate. Then, a photoresist film can be formed on the TEOS oxide layer. After that, an exposure and development process can be performed with respect to the photoresist film using a mask defining the active area and the isolation area and a mask defining the gate electrode area, thereby patterning the photoresist film. At this time, the photoresist film of the isolation area and the gate electrode area is removed.

Then, the pad oxide layer, the pad nitride layer, and the TEOS oxide layer on the isolation area and the gate electrode area can be selectively removed using the patterned photoresist film as a mask.

The isolation area and the gate electrode area of the semiconductor substrate can be etched to a predetermined depth using the patterned pad oxide layer, the pad nitride layer, and the TEOS oxide layer as a mask, thereby forming a trench. Then, the photoresist film is completely removed.

Next, the trench can be filled with an insulating material, thereby forming the isolation layers 163a and 163b in the trench. After that, the pad oxide layer, the pad nitride layer, and the TEOS oxide layer can be removed.

Accordingly, the first isolation layer 163a is formed on the isolation area, and the second isolation layer 163b is formed on the gate electrode area.

In one embodiment, at least one of the first isolation layer 163a and the second isolation layer 163b may include an oxide layer, which is partially oxidized through a local oxidation of silicon (LOCOS) process. In comparison with the STI process, the LOCOS process lowers stress and may reduce a problem caused by a dark current.

Figure 4B:
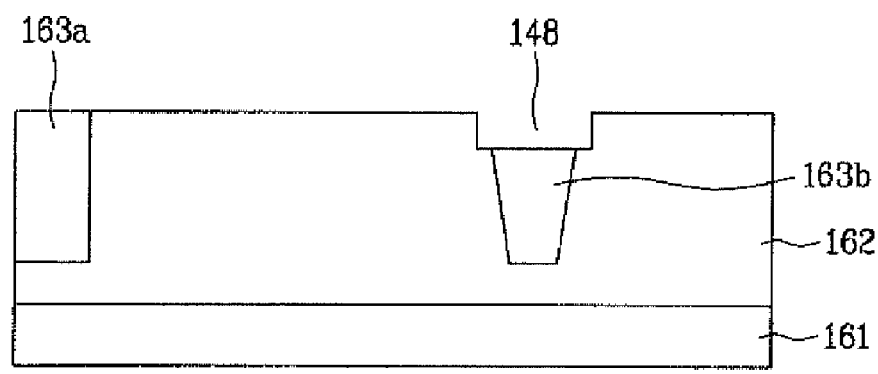

Referring to FIG. 4B, a photoresist film can be coated on the semiconductor substrate having the isolation layers 163a and 163b, and a photomask having a predetermined pattern can be aligned on the upper part of the photoresist film. Thereafter, an exposure process is performed by irradiating light on the photomask, and then a development process is performed with respect to the exposed photoresist film, thereby patterning the photoresist film. Accordingly, a photoresist pattern exposing the second isolation layer 163b is formed.

An etching process can be performed with respect to the resultant structure using the photoresist pattern as a mask, thereby removing an upper part of the second isolation layer. Thus, a trench 148 can be formed.

The trench 148 can be formed such that the width of the trench 148 is approximately the same as the width of a gate electrode to be formed later.

Figure 4C:
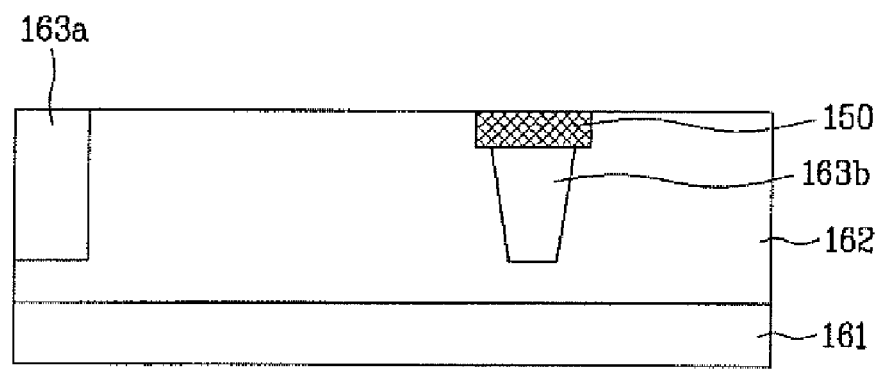

Next, referring to FIG. 4C, a conductive layer, such as a polysilicon layer, can be formed on the entire surface of the semiconductor substrate 161 formed with the trench 148. Then, a planarization process, such as a CMP process, can be performed until the semiconductor substrate 161 is exposed, such that the conductive layer 150 remains only in the trench 148.

Next, an ion implantation process can be performed with respect to the buried conductive layer 150, thereby forming a doped conductive layer 150. The doped conductive layer 150 is defined as a channel area of a transistor to be formed later.

Figure 4D:
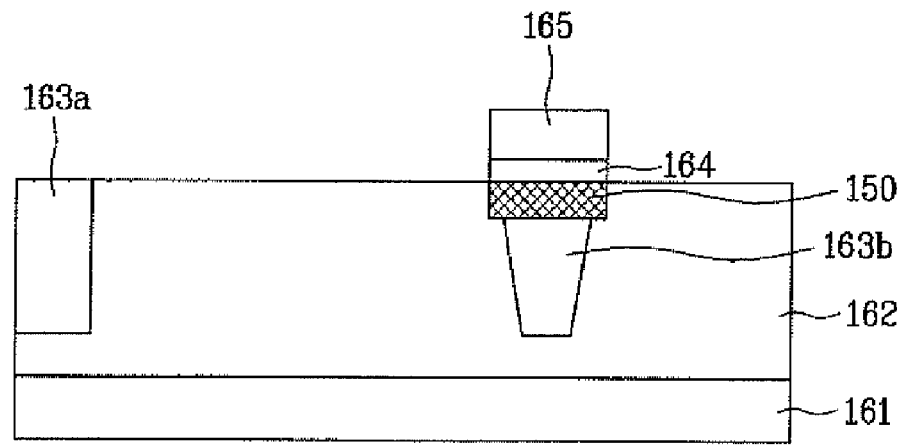

Then, referring to FIG. 4D, a gate insulating layer 164 and a conductive layer can be sequentially deposited on the entire surface of the substrate, which was formed with the first and the second isolation layers 163a and 163b.

In an embodiment, the conductive layer can be a silicon layer. The insulating layer 164 may be formed through a thermal oxidation process or a chemical vapor deposition (CVD) scheme.

Then, the conductive layer and the gate insulating layer 164 can be selectively removed, to form the gate electrode 165.

Figure 4E:
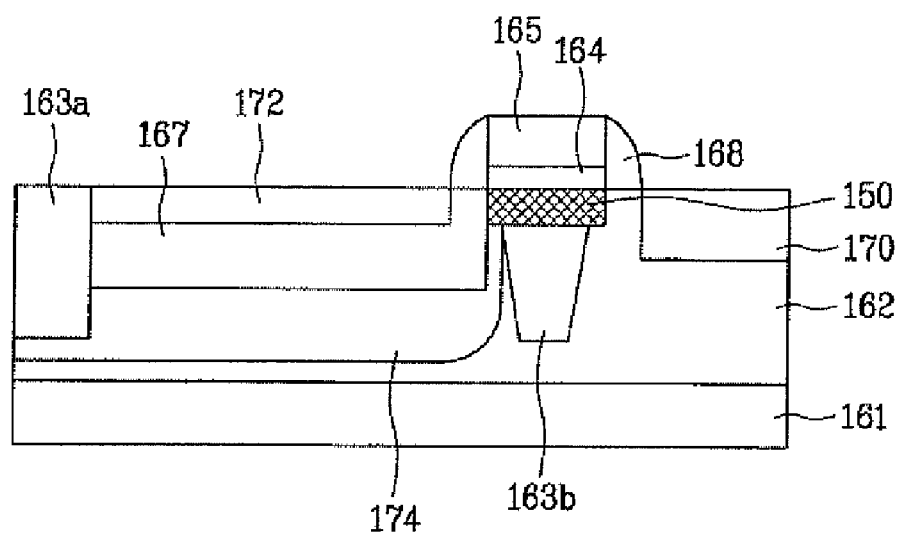

Referring to FIG. 4E, a photoresist film can be coated on the entire surface of the semiconductor substrate formed with the gate electrode 165 and the gate insulating layer 164, and selectively patterned by an exposure and development process to expose each photodiode area. Then, second conductive type (N type) dopants can be implanted at low concentration into the epitaxial layer 162 by using the patterned photoresist film as a mask, thereby forming an N type diffusion area 167 in the photodiode area.

Next, after removing the photoresist film, and forming an insulating layer on the entire surface of the semiconductor substrate 162, including the diffusion area 167, an etchback process can be performed to form spacers 168 at both sides of the gate electrode 165.

Then, another photoresist film can be coated on the entire surface of the semiconductor substrate 161, including the spacers 168, and patterned by an exposure and development process to expose a source/drain area (floating diffusion area) of each transistor while covering each photodiode area.

Then, second conductive type (N type) dopants can be implanted at high concentration into the exposed source/drain area using the patterned photoresist film as a mask, thereby forming an N type diffusion area (floating diffusion area) 170.

Then, the photoresist film is removed. Next, yet another photoresist film is coated on an entire surface of the semiconductor substrate 161 and patterned through an exposure and development process to expose each photodiode area. Subsequently, first conductive type (P type) dopants can be implanted into the epitaxial layer 162 formed with the N type diffusion area 167 using the patterned photoresist film as a mask, to form a P type diffusion area 172 on the surface of the epitaxial layer 162.

The photoresist film can be removed, and a heat treatment process can be performed with respect to the semiconductor substrate 161 for diffusing each impurity diffusion area.

Accordingly, although a depletion area 174 of the N type diffusion area 167 formed in the photodiode area expands during operation, the occurrence of punchthrough between the N type diffusion area 170 of the transfer transistor and the low-density N type diffusion area 167 is prevented by the second isolation layer 163b.

Next, metal interconnections having a plurality of interlayer dielectric layers may be formed on the entire surface of the resultant structure, and then a color filter layer and a microlens can be formed to complete the formation of an image sensor.

As described above, according to embodiments of the present invention, a second isolation layer is formed between the photodiode area and the transfer transistor, so that punch-through between impurity areas formed in the transfer transistor and the photodiode area can be prevented. Accordingly, electrons created in a photodiode by light can be prevented from going out of the photodiode before the transistor is turned on. Therefore, the sensitivity of an image sensor can be improved, the low luminous characteristics of the image sensor can be enhanced, and a dark current generated before the transistor is turned on can be reduced.

I claim:

1. A CMOS image sensor, comprising:
   a photodiode area and a floating diffusion area formed on a semiconductor substrate;
   a transistor formed on the semiconductor substrate between the photodiode area and the floating diffusion area;
   an isolation layer formed below the transistor; and
   a channel area formed between the transistor and the isolation layer,
   wherein the isolation layer is buried in a first trench, and wherein the channel area is buried in a second trench on an upper side of the first trench.

2. The CMOS image sensor according to claim 1, wherein the semiconductor substrate comprises a first conductive type low density epitaxial layer.

3. The CMOS image sensor according to claim 1, wherein the photodiode area comprises a second conductive type low density diffusion area and a first conductive type high density diffusion area formed on the second conductive type low density diffusion area.

4. The CMOS image sensor according to claim 1, wherein the floating diffusion area comprises a second conductive type high density diffusion area.

5. The CMOS image sensor according to claim 1, wherein the isolation layer comprises an insulating material formed in a trench.

6. The CMOS image sensor according to claim 1, wherein the isolation layer comprises an oxide layer formed through a local oxidation of silicon (LOCOS) process.

7. The CMOS image sensor according to claim 1, wherein the channel area comprises a conductive layer formed in a trench.

8. The CMOS image sensor according to claim 1, wherein the photodiode area is disposed to a first side of the isolation layer and the floating diffusion area is disposed to a second side of the isolation layer.

9. The CMOS image sensor according to claim 1, wherein the channel area comprises a polysilicon layer disposed directly below the transistor.

10. The CMOS image sensor according to claim 1, wherein the width of the isolation layer formed below the transistor is less than the width of the transistor.

11. The CMOS image sensor according to claim 1, wherein the width of the bottom portion of the isolation layer is less than the width of the top portion of the isolation layer.

* * * * *